(12) United States Patent
Maeda et al.

(10) Patent No.: US 11,264,519 B2
(45) Date of Patent: Mar. 1, 2022

(54) LIGHT-RECEIVING ELEMENT AND METHOD FOR MANUFACTURING ELEMENT

(71) Applicant: Nippon Telegraph and Telephone Corporation, Tokyo (JP)

(72) Inventors: Yoshiho Maeda, Tokyo (JP); Fumito Nakajima, Tokyo (JP); Yoshifumi Muramoto, Tokyo (JP); Atsushi Kanda, Tokyo (JP); Kimikazu Sano, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 14 days.

(21) Appl. No.: 17/044,461

(22) PCT Filed: Mar. 27, 2019

(86) PCT No.: PCT/JP2019/013185
§ 371 (c)(1),
(2) Date: Oct. 1, 2020

(87) PCT Pub. No.: WO2019/194043
PCT Pub. Date: Oct. 10, 2019

(65) Prior Publication Data
US 2021/0043785 A1    Feb. 11, 2021

(30) Foreign Application Priority Data

Apr. 5, 2018   (JP) .............................. JP2018-072905

(51) Int. Cl.
*H01L 31/0232* (2014.01)

(52) U.S. Cl.
CPC .. *H01L 31/02327* (2013.01); *H01L 31/02325* (2013.01)

(58) Field of Classification Search
CPC ........... H01L 31/0232; H01L 31/02327; H01L 31/0203–0216
See application file for complete search history.

(56) References Cited

U.S. PATENT DOCUMENTS

2013/0270426 A1* 10/2013 Yang ................. H01L 31/02327
                                                                250/226
2014/0167107 A1    6/2014 Yoneda et al.

FOREIGN PATENT DOCUMENTS

JP    2006295481 A    10/2006
JP    2014093459 A    5/2014

* cited by examiner

*Primary Examiner* — Suberr L Chi
(74) *Attorney, Agent, or Firm* — Slater Matsil, LLP

(57) ABSTRACT

A light receiving element includes a first substrate, a photodiode formed on a main surface of the first substrate, and a second substrate constituted by a semiconductor and adhered to a rear surface side of the first substrate by an adhesive layer formed from a resin adhesive. A light receiving element according to an embodiment includes a lens that is formed on the side of an adhesion surface of the second substrate, has a convex surface, and is disposed in a light receiving region of the photodiode. The light receiving side of the photodiode is oriented toward the side of the first substrate. The lens is disposed so that the convex surface thereof is oriented toward the side of a light receiving surface of the photodiode.

6 Claims, 21 Drawing Sheets

LIGHT-RECEIVING ELEMENT AND METHOD FOR MANUFACTURING ELEMENT

CROSS-REFERENCE TO RELATED APPLICATIONS

This application is a national phase entry of PCT Application No. PCT/JP2019/013185, filed on Mar. 27, 2019, which claims priority to Japanese Application No. 2018-072905, filed on Apr. 5, 2018, which applications are hereby incorporated herein by reference.

TECHNICAL FIELD

The present invention relates to a light receiving element that includes a photodiode and a lens, and an element manufacturing method.

BACKGROUND

With increases in the speed of optical communication, the light receiving diameter of a light receiving element (a photodiode) mounted on a light receiver is becoming more and more minute. For example, the light receiving diameter of a surface-incident photodiode required for a 50 Gbps-class, 100 Gbps operation is approximately 10 µm. In particular, during use in a wavelength division multiplexing (WDM) system, it is important to couple spreading light from an optical filter existing in front of the photodiode to a light receiving surface of the photodiode after sufficiently focusing the light.

As shown in FIG. 8, to ensure that light enters a photodiode having a minute light receiving diameter with a high degree of efficiency, a technique for integrating a microlens 403 having a convex surface formed using a well-known etching technique with a substrate 401 having a photodiode 402 disposed thereon has been proposed (see PTL 1). Note that the entrance surface of the photodiode 402 is disposed on the side of the substrate 401, while an electrode 405 is formed on the surface on the opposite side. A technique for integrating another substrate having a microlens formed thereon by adhering the other substrate to the substrate of the photodiode is also available as this type of microlens.

A spot size (1/e²) in a focus position when the spreading light enters the lens is typically dependent on a working distance (WD) of the lens and a curvature radius R of the lens, and this dependence relationship is as shown in FIG. 9. As shown in FIG. 9, the spot size in the focus position decreases as the WD increases, or in other words as the beam diameter on the spherical surface of the lens increases.

For example, here, at 40 µm or more, which is a generally manufacturable range of R in a microlens such as that described above, it is necessary to obtain a WD with which light is condensed to or below the light receiving diameter (10 µm) of the photodiode. For this purpose, a pedestal 404 with a height of approximately 10 µm is formed on the substrate 401 around the microlens 403.

Well-known photolithography and dry etching techniques, as illustrated below, are used to form the microlens 403 and the pedestal 404.

First, as shown in FIG. 10A, the photodiode 402 is formed on the substrate 401, which is constituted by a semiconductor, whereupon a rear surface of the substrate 401 is thinned by mechanical polishing until the substrate 401 reaches a desired substrate thickness. Next, as shown in FIG. 10B, a mask pattern 411 and a mask pattern 412 constituted by novolak-based resist, for example, are formed on the rear surface of the substrate 401 using a well-known photolithography technique. The mask pattern 411 includes an opening disposed in a microlens formation region. Further, the mask pattern 412 is a columnar pattern disposed in the microlens formation region.

Next, the formed mask patterns 411 and 412 are reflowed by being heated to the glass transition point temperature of the resist, whereupon the mask pattern 412 is molded into a convex surface shape, as shown in FIG. 10C. Next, as shown in FIG. 10D, the microlens 403 is formed by a well-known reactive ion etching technique using the convex surface-shaped mask pattern 412.

For example, the microlens 403 can be formed by performing etching under conditions at which the mask pattern 412 and the substrate 401 reach an identical etching rate so as to transfer the shape of the mask pattern 412. At this time, the shape of the mask pattern 411 is also transferred, and as a result, the pedestal 404 is formed together with the microlens 403. Note that during the etching processing, the microlens 403 and the pedestal 404 are formed and the mask patterns 411 and 412 are removed by etching.

Next, as shown in FIG. 10E, a mask pattern 413 masking a part of the pedestal 404 is formed. Next, etching processing is performed until the pedestal 404 is formed at a target height, and by digging into an inside region of the pedestal 404, as shown in FIG. 10F, the pedestal 404 is formed to be higher than an apex portion of the microlens 403.

CITATION LIST

Patent Literature

PTL 1—Japanese Patent Application Publication No. 2014-093459

SUMMARY

Technical Problem

Incidentally, in the conventional technique described above, etching processing is also performed on a part of the formed lens in order to set the pedestal at the desired height, and as a result, during the etching processing undertaken to form the pedestal, the lens portion deforms so that the diameter of the lens decreases or the like, for example. Accordingly, controlling the lens shape is extremely difficult, making it difficult to manufacture a lens-integrated photodiode having a pedestal with a height of approximately several tens of m with a high degree of precision and good reproducibility. For example, as is well known, a large number of elements are formed simultaneously on a single wafer, but because controlling the lens shape is difficult, as described above, it is difficult to manufacture the respective elements evenly and precisely within the wafer surface.

Embodiments of the present invention have been designed to solve the problem described above, and an object thereof is to enable a light receiving element in which a lens is integrated with a photodiode to be manufactured with good reproducibility.

Means for Solving the Problem

A light receiving element according to embodiments of the present invention includes a first substrate, a photodiode formed on a main surface of the first substrate so that a light receiving side thereof is oriented toward the side of the first substrate, a second substrate constituted by a semiconductor and adhered to a rear surface side of the first substrate by an adhesive layer formed from a resin adhesive, and a lens that has a convex surface formed on the side of an adhesion surface of the second substrate and is disposed in a light receiving region of the photodiode.

In the light receiving element described above, the adhesive layer is charged between the first substrate and the second substrate.

The light receiving element described above further includes a pedestal portion formed around the lens on the side of the adhesion surface of the second substrate, wherein a height of the pedestal portion and a height of the lens are set to be equal.

Further, an element manufacturing method according to embodiments of the present invention includes a first step for bringing a first substrate having a plurality of first elements formed thereon and a second substrate having a plurality of second elements formed thereon into contact with each other via an adhesive layer formed from a resin thermosetting adhesive, a second step for moving the first substrate and the second substrate relative to each other in order to align respective positions of the first elements and the second elements, a third step for applying an ultraviolet curable adhesive to provisional bonding locations in parts between respective peripheral portions of the first substrate and the second substrate, a fourth step for provisionally bonding the first substrate to the second substrate by irradiating the ultraviolet curable adhesive with ultraviolet rays in order to cure the ultraviolet curable adhesive, and a fifth step for bonding the first substrate to the second substrate by heating the adhesive layer in order to cure the adhesive layer.

In the element manufacturing method described above, the first element is a photodiode formed on a main surface of the first substrate so that a light receiving side thereof is oriented toward the side of the first substrate, and the second element is a lens that has a convex surface formed on the side of an adhesion surface of the second substrate, which is constituted by a semiconductor, and is disposed in a light receiving region of the photodiode.

In the element manufacturing method described above, the second element further includes a pedestal portion formed around the lens on the side of the adhesion surface of the second substrate, and a height of the pedestal portion and a height of the lens are set to be equal.

Effects of Embodiments of the Invention

According to embodiments of the present invention, as described above, an advantageous effect is obtained in that a first substrate that includes a photodiode and a second substrate that is constituted by a semiconductor having a lens with a concave surface formed thereon are adhered by an adhesive layer formed from a resin adhesive, and as a result, a light receiving element in which a lens is integrated with a photodiode can be manufactured with good reproducibility.

DETAILED DESCRIPTION OF ILLUSTRATIVE EMBODIMENTS

Figure 1:
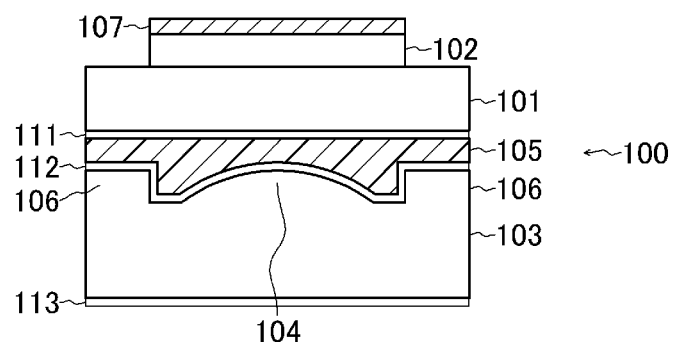
FIG. 1 is a sectional view showing a configuration of a light receiving element according to an embodiment of the present invention.

A light receiving element according to an embodiment of the present invention will be described below with reference to FIG. 1. A light receiving element 100 includes a first substrate 101, a photodiode 102 formed on a main surface of the first substrate 101, and a second substrate 103 constituted by a semiconductor and adhered to a rear surface side of the first substrate 101 by an adhesive layer 105 formed from a resin adhesive. The light receiving element 100 according to this embodiment includes a lens 104 that is formed on the side of an adhesion surface of the second substrate 103, constituted by a convex surface, and disposed in a light receiving region of the photodiode 102.

In this embodiment, a light receiving side of the photodiode 102 is oriented toward the side of the first substrate 101. Further, an electrode 107 is provided on the opposite side of the photodiode 102 to the light receiving side. Furthermore, the lens 104 is disposed such that the convex surface is oriented toward the side of a light receiving surface of the photodiode 102. Moreover, the adhesive layer 105 is charged between the first substrate 101 and the second substrate 103 so as to absorb height differences caused by irregularities on the lens 104. The lens 104 is constituted by a semiconductor while the adhesive layer 105 is formed from resin, and therefore a large refractive index difference exists between the two. For example, a typical refractive index of resin is approximately 1.5, while the refractive index of a semiconductor exceeds 3. Therefore, a sufficient focusing effect is obtained by the lens 104.

Note that in this embodiment, a pedestal portion 106 is provided around the lens 104 on the side of the adhesion surface of the second substrate 103. The height of the pedestal portion 106 and the height of the lens 104 are set to be equal. Further, an anti-reflection film 111 constituted by a dielectric multilayer film is formed on the rear surface of the first substrate 101, and an anti-reflection film 112 constituted by a dielectric multilayer film is also formed on the surface of the second substrate 103 on which the lens 104 is formed. An anti-reflection film 113 constituted by a dielectric multilayer film is also formed on the rear surface of the second substrate 103.

The first substrate 101 is formed from InP, Si, or the like, for example. Further, the second substrate 103 is formed from InP, GaAs, Si, or the like, for example.

Figure 2:
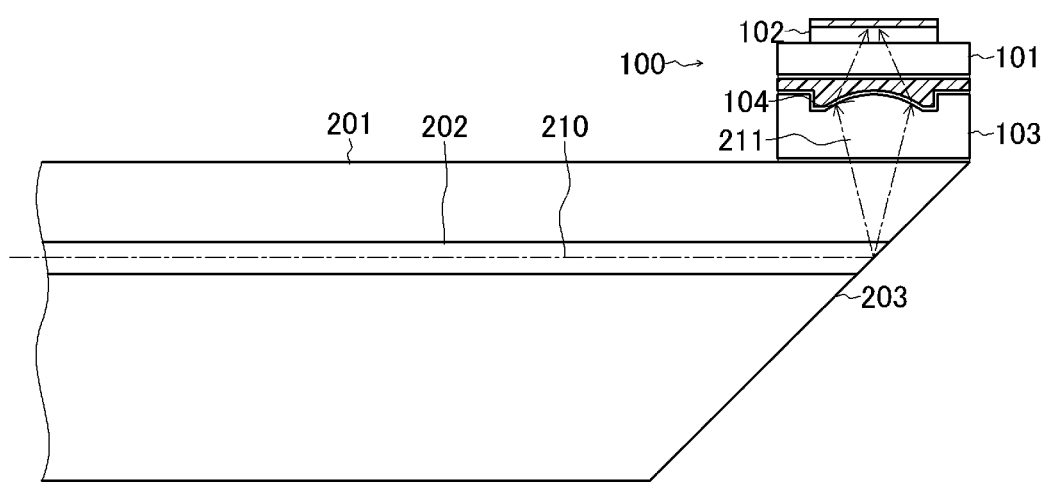
FIG. 2 is a sectional view showing the configuration of the light receiving element according to this embodiment of the present invention.

According to this embodiment, by controlling the thickness of the second substrate 103, the light receiving region of the photodiode 102 can be aligned with the focus position of the lens 104. For example, as shown in FIG. 2, light 210 guided through a core 202 of an optical waveguide device 201 forming an optical filter or the like is reflected by a mirror portion 203 and emitted to the side of the light receiving element 100 so as to spread. This spreading light 211 is focused by the lens 104 so as to enter the photodiode 102. In this configuration, the distance over which the light emitted from the optical waveguide device 201 travels before reaching the lens 104 is determined by the thickness of the second substrate 103. Therefore, by increasing the thickness of the second substrate 103, the spread diameter of the spreading light 211 on the lens 104 can be increased. As a result, the spot size in the focus position of the lens 104 can be reduced.

Figure 3A:
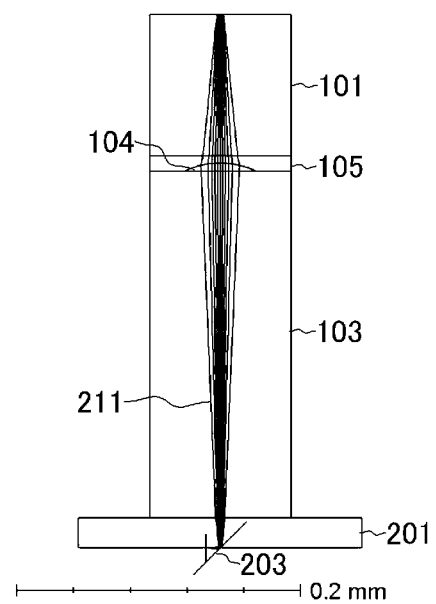
FIG. 3A is a characteristic view showing a light ray image obtained when spreading light 211 emitted from an optical waveguide device 201 is received by a photodiode 102 after being focused by a lens 104.
Figure 3B:
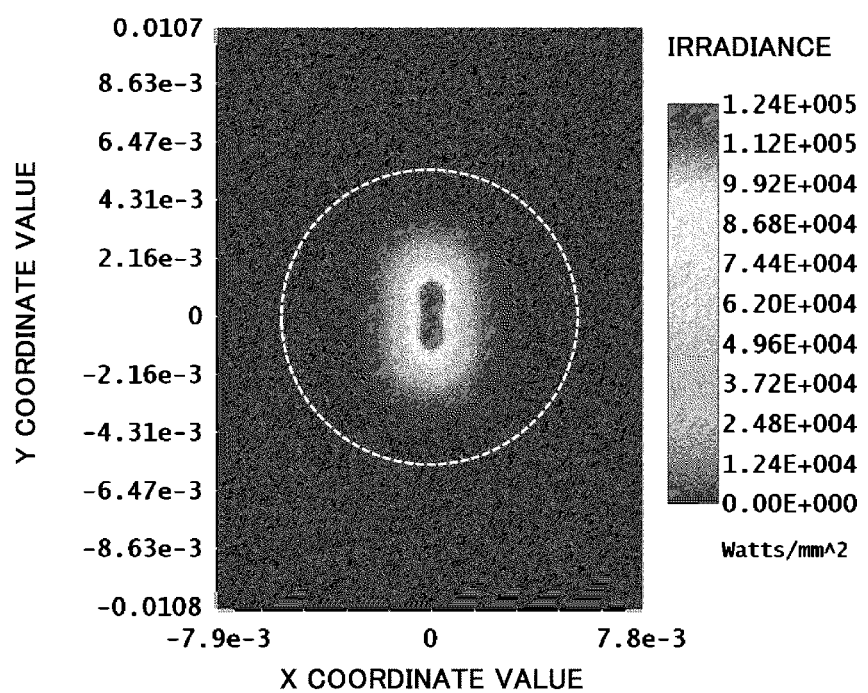
FIG. 3B is a characteristic view showing a state of a spot image formed on a light receiving surface when the spreading light 211 emitted from the optical waveguide device 201 is received by the photodiode 102 after being focused by the lens 104.

Next, a light ray image (FIG. 3A), the state of a spot image on the light receiving surface (FIG. 3B), and the state of coupling efficiency with respect to a substrate material (FIG. 3C) when the spreading light 211 emitted from the optical waveguide device 201 is received by the photodiode 102 after being focused by the lens 104 will be described using results of an implemented simulation.

First, the second substrate 103 was formed from Si, and the plate thickness thereof was set at 250 μm. Accordingly, the lens 104 was formed from Si. Further, the curvature R of the convex surface of the lens 104 was set at 60 μm. Furthermore, the first substrate 101 was formed from InP, and the plate thickness thereof was set at 100 μm. Further, the optical waveguide device 201 was formed from a silca-based planar lightwave circuit (PLC), and a model in which the advancement direction of the light guided thereby is modified by 90° by the mirror portion 203, whereupon the light passes through the second substrate 103 and enters the lens 104, was used. Here, the beam radius of the light immediately after exiting the optical waveguide device 201 was set at w0x=5.6 μm, w0y=2.8 μm. Moreover, a perfect circle with a light receiving diameter of 10 μm was envisaged as the light receiving portion of the photodiode 102.

Figure 3C:
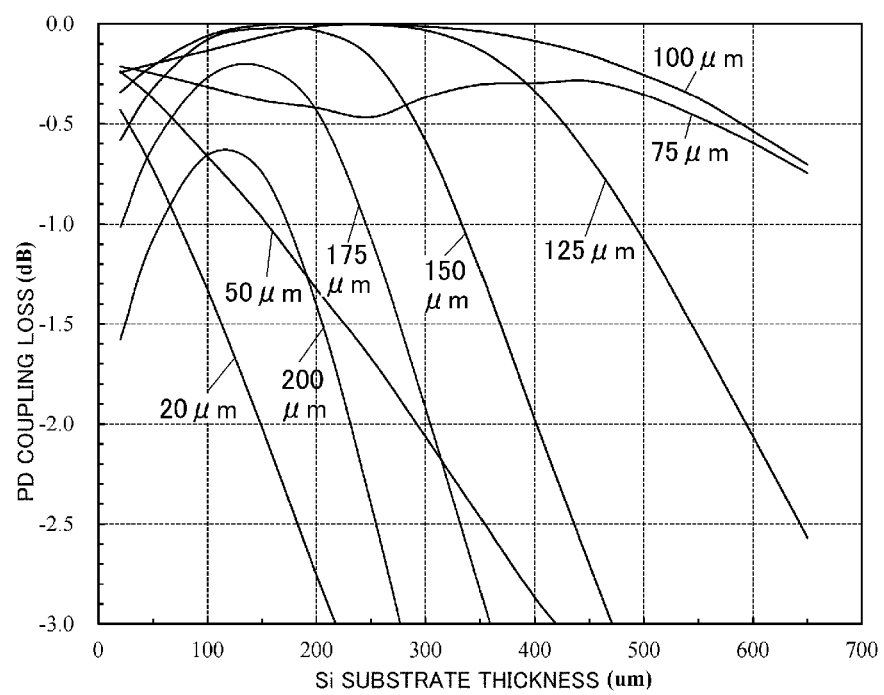
FIG. 3C is a characteristic view showing a state of coupling efficiency with respect to a substrate material when the spreading light 211 emitted from the optical waveguide device 201 is received by the photodiode 102 after being focused by the lens 104.

As shown in FIG. 3C, by appropriately selecting the thicknesses of the respective substrates, optical coupling on the photodiode 102 having a light receiving diameter of 10 μm can be achieved highly efficiently, with substantially no loss. Hence, according to this embodiment, by appropriately setting the thickness of the second substrate 103, highly efficient optical coupling can be realized, thereby eliminating the need to increase the height of the pedestal portion 106 provided around the lens 104 to several tens of m or the like.

Further, as described above, an appropriate distance is set in accordance with the thickness of the substrate, and therefore, in this respect, the pedestal portion 106 does not have to be provided. The pedestal portion 106 is used to ensure that the orientation of the lens 104 directly opposes the light receiving surface of the photodiode 102 so that the focus position of the lens 104 is disposed in the center of the light receiving surface. Therefore, if the first substrate 101 and the second substrate 103 can easily be adhered so as to remain parallel to each other, the pedestal portion 106 is not required. The first substrate 101 and the second substrate 103 can easily be adhered so as to remain parallel to each other by, for example, forming a plurality of photodiodes 102 on the first substrate 101, which is constituted by a wafer, forming a plurality of lenses 104 on the second substrate 103, which is constituted by a wafer, in alignment with the plurality of photodiodes 102, and adhering the substrates.

According to this embodiment, as described above, a high pedestal portion with a height of several tens of m or the like is not required, and therefore the lens shape can be controlled easily. As a result, a light receiving element in which a lens is integrated with a photodiode can be manufactured with good reproducibility.

Figure 4A:
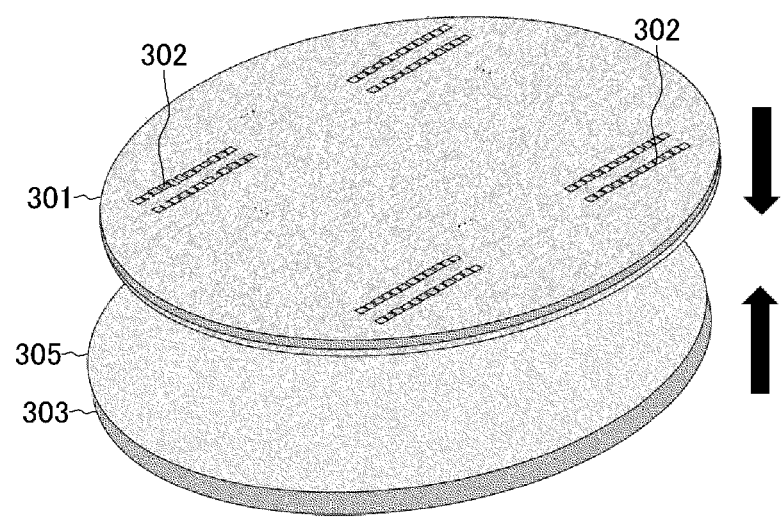
FIG. 4A is a sectional view showing a state of a process in order to illustrate an element manufacturing method according to this embodiment of the present invention.

Next, an element manufacturing method according to an embodiment of the present invention will be described with reference to FIGS. 4A to 4D. A method for manufacturing the light receiving element of the above embodiment will be described below as an example. First, as shown in FIG. 4A, a first wafer (a first substrate) 301 having a plurality of photodiodes (first elements) 302 formed thereon and a second wafer (a second substrate) 303 having microlenses (second elements; not shown) formed thereon are prepared. The plurality of microlenses are formed on the second wafer 303 by patterning the wafer surface using well-known photolithography and etching techniques. Note that the first wafer 301 and the second wafer 303 are thinned to desired substrate thicknesses by a well-known substrate polishing technique.

Further, an adhesive layer 305 formed from a resin thermosetting adhesive is disposed between the first wafer 301 and the second wafer 303. For example, the adhesive layer 305 is disposed by applying the resin thermosetting adhesive to either the microlens formation surface of the second wafer 303 or the rear surface of the first wafer 301. For example, any thermosetting adhesive that is transparent to light in a communication wavelength band and has sufficient adhesive strength, for example benzocyclobutene (BCB), may be used.

Figure 4B:
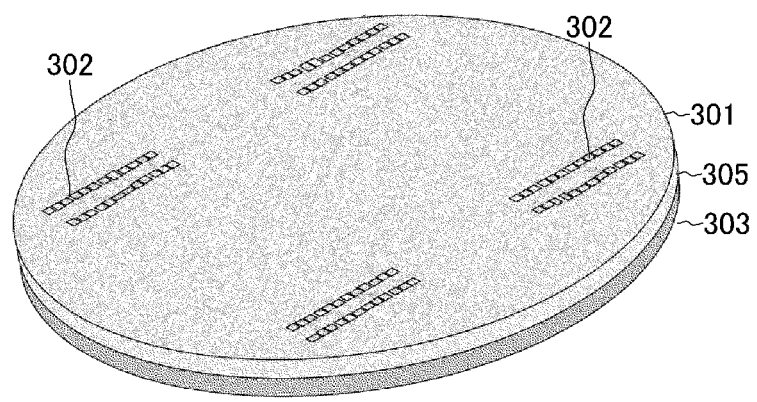
FIG. 4B is a sectional view showing a state of a process in order to illustrate the element manufacturing method according to this embodiment of the present invention.

Next, as shown in FIG. 4B, the rear surface of the first wafer 301 and the lens formation surface of the second wafer 303 are brought into contact with each other via the adhesive layer 305 (first step). Next, the first wafer 301 and the second wafer 303 are moved relative to each other to position (align) the photodiodes and the microlenses (second step). In this state, the two substrates are fixed by a jig or the like (not shown).

Figure 4C:
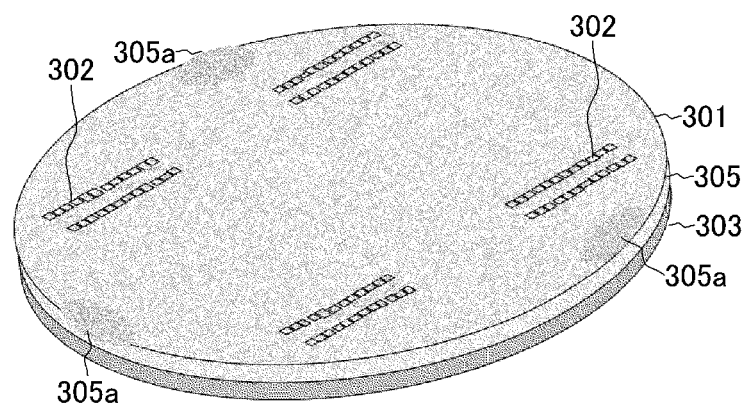
FIG. 4C is a sectional view showing a state of a process in order to illustrate the element manufacturing method according to this embodiment of the present invention.

Next, as shown in FIG. 4C, in a state where the two substrates have been positioned and fixed by the jig, not shown in the figures, an ultraviolet curable adhesive is applied to (disposed in) provisional bonding locations 305a in parts between respective peripheral portions of the first wafer 301 and the second wafer 303. In the example shown in FIG. 4C, the ultraviolet curable adhesive is applied between the first wafer 301 and the second wafer 303 in three provisional bonding locations 305a on the peripheral portions of the wafers (third step). A 3M (registered trademark) UV-curable adhesive of the LC5320 series, for example, may be used as the ultraviolet curable adhesive.

Next, in a state where the substrates are fixed by the jig, not shown in the figures, the ultraviolet curable adhesive in the provisional bonding locations 305a is cured by being irradiated with ultraviolet rays so that the first wafer 301 and the second wafer 303 are provisionally bonded (fourth step). In order to cure the ultraviolet curable adhesive in the provisional bonding locations 305a disposed on the peripheral portions of the wafers, it is not necessary to emit ultraviolet rays so as to penetrate the wafers, and instead, the ultraviolet rays may be emitted onto the ultraviolet curable adhesive from side portions of the wafers. In this state, the adhesive layer 305 is not yet cured.

Figure 4D:
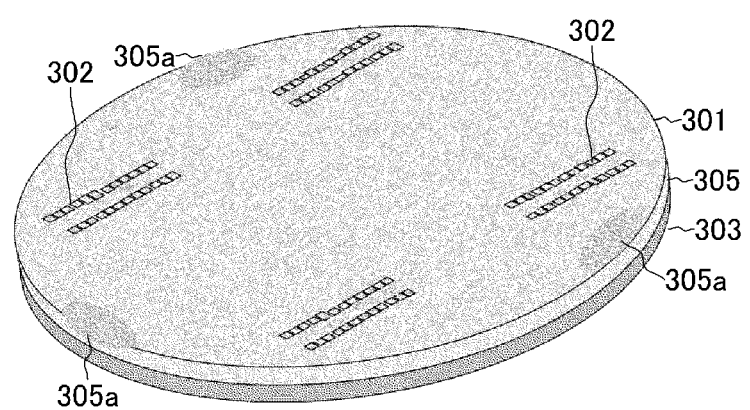
FIG. 4D is a sectional view showing a state of a process in order to illustrate the element manufacturing method according to this embodiment of the present invention.

Next, the adhesive layer 305 is cured by being heated, whereby, as shown in FIG. 4D, the first wafer 301 and the second wafer 303 are bonded. The bonded wafers are then cut into chips using a well-known dicing technique or the like.

Here, when high-precision positioning is required, as in the case of the photodiode 102 and the lens 104, during wafer bonding using the adhesive layer 305, which is formed from a resin thermosetting adhesive, the adhesive layer 305 is cured by being heated. Hence, during the course of a curing reaction that occurs when heat is applied, the adhesive layer 305 undergoes plastic deformation. In this state, the positional relationship between the first wafer 301 and the second wafer 303 may vary by approximately several tens of m, for example. When positional variation occurs in this manner, the positioning state between the respective photodiodes and microlenses shifts.

However, when provisional bonding is implemented by performing ultraviolet curing on the ultraviolet curable adhesive in the intermittently disposed provisional bonding locations 305a, shifting of the positioning state during thermal curing can be eliminated, and as a result, the wafers can be bonded with a high degree of positional precision of approximately ±several μm, for example. Moreover, since the shape of the lens is basically the same as a conventional shape and a high pedestal portion with a height of several tens of m is not required, highly precise control of the lens shape can be implemented more easily.

Figure 5A:
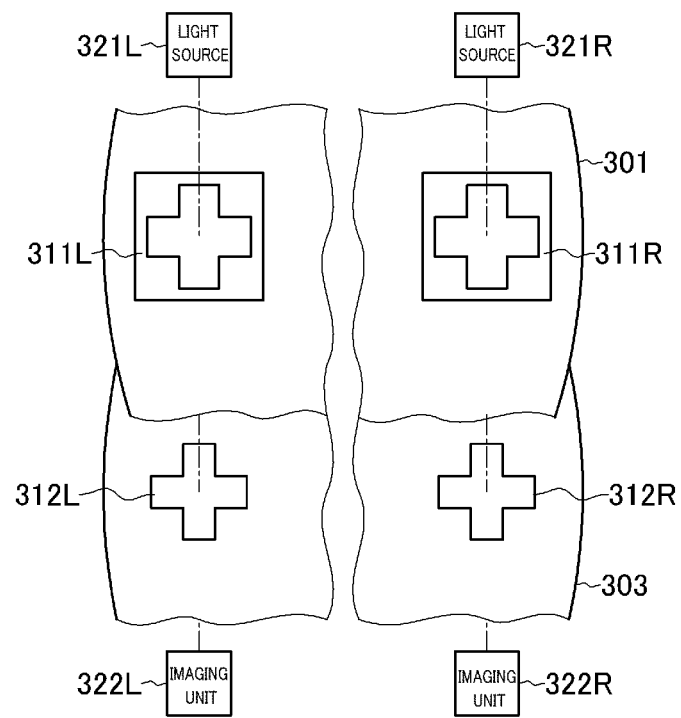
FIG. 5A is an illustrative view illustrating positioning performed in the element manufacturing method according to this embodiment of the present invention.
Figure 5B:
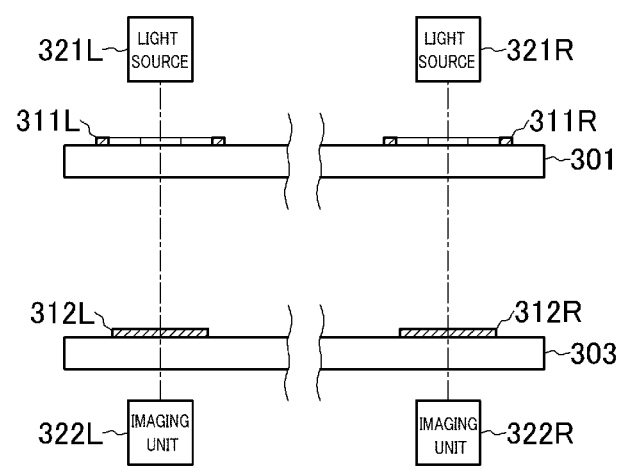
FIG. 5B is an illustrative view illustrating positioning performed in the element manufacturing method according to this embodiment of the present invention.

Incidentally, as shown in FIGS. 5A and 5B, for example, the high-precision positioning is implemented by overlapping alignment marks 311L, 311R formed on the first wafer 301 and alignment marks 312L, 312R formed on the second wafer 303. The alignment marks are disposed on the respective peripheral portions of the wafers. For example, a positional relationship of the alignment marks 311L, 311R to the center of the first wafer 301 is identical to a positional relationship of the alignment marks 312L, 312R to the center of the second wafer 303.

Figure 6:
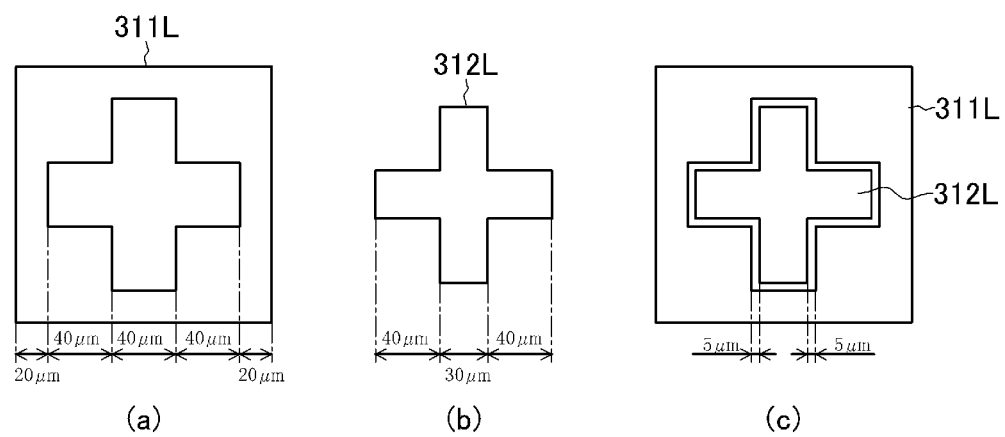
FIG. 6 is an illustrative view illustrating positioning performed in the element manufacturing method according to this embodiment of the present invention.

For example, as shown in (a) of FIG. 6, the alignment marks 311L, 311R each include a cross-shaped opening portion. Further, as shown in (b) of FIG. 6, the alignment marks 312L, 312R are each formed in a cross shape. As shown in (c) of FIG. 6, positioning is achieved by evenly disposing the cross shapes of the alignment marks 312L, 312R inside the cross-shaped opening portions of the alignment marks 311L, 311R.

Positioning by overlapping the alignment marks, as described above, can be performed using a well-known IR transmission method, for example. For example, infrared rays from light sources 321L, 321R are transmitted through the alignment marks 311L, 311R and the alignment marks 312L, 312R, whereupon images thereof are formed by imaging units 322L, 322R.

Figure 7:
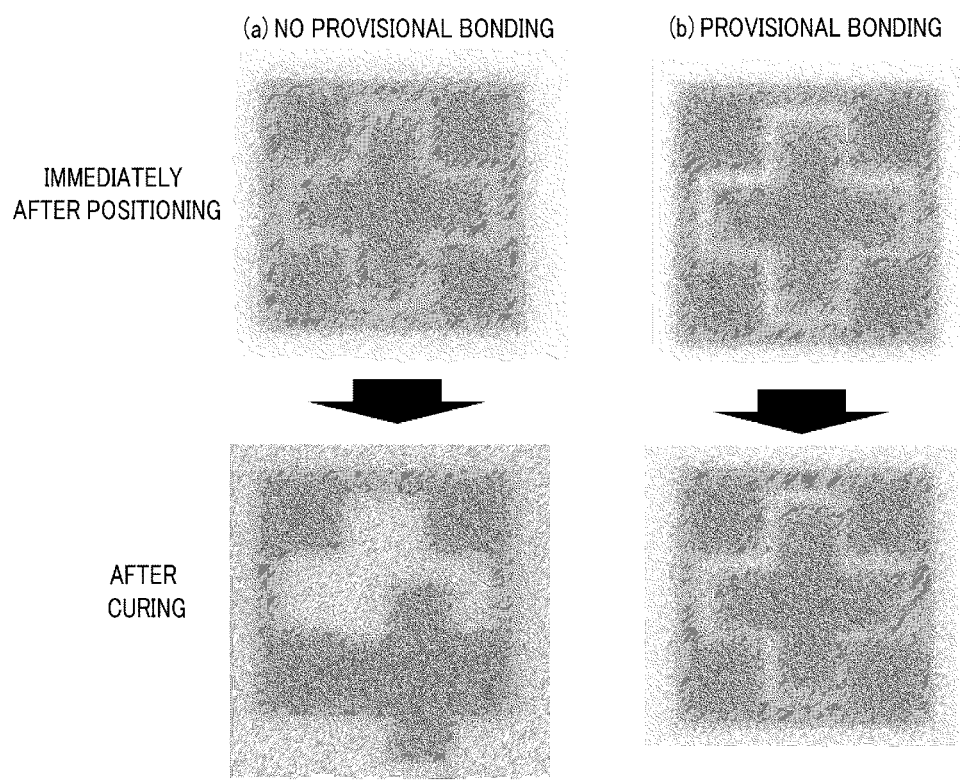
FIG. 7 is an illustrative view illustrating positioning performed in the element manufacturing method according to this embodiment of the present invention.
Figure 8:
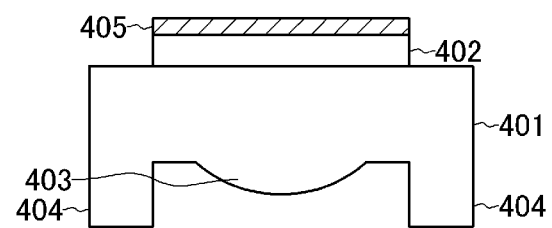
FIG. 8 is a sectional view showing a configuration of a conventional light receiving element.
Figure 9:
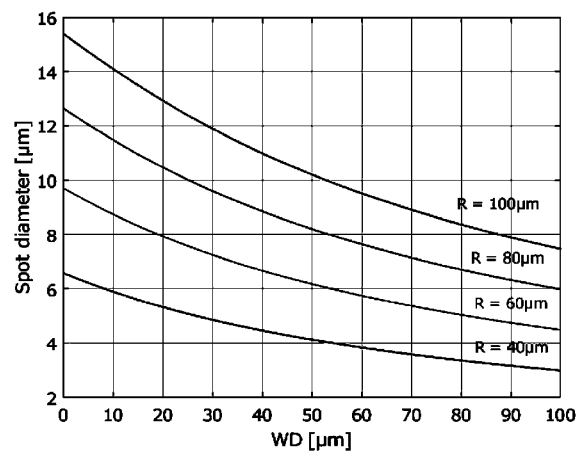
FIG. 9 is a characteristic view showing how a relationship between a spot size ($1/e^2$) obtained in a focusing position when spreading light enters a lens and a working distance (WD) of the lens is dependent on a curvature radius R of the lens.
Figure 10A:
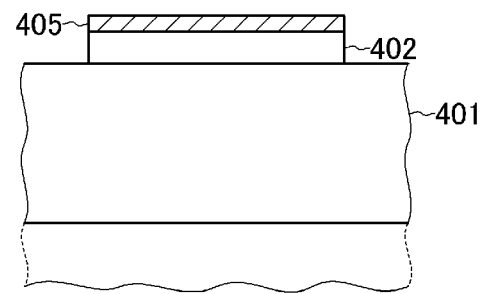
FIG. 10A is a sectional view showing a state of a process in order to illustrate a conventional method of manufacturing a light receiving element.
Figure 10B:
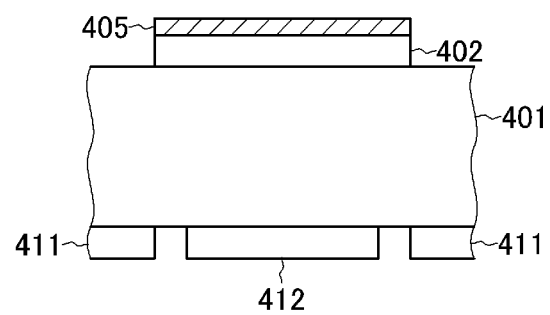
FIG. 10B is a sectional view showing a state of a process in order to illustrate the conventional method of manufacturing a light receiving element.
Figure 10C:
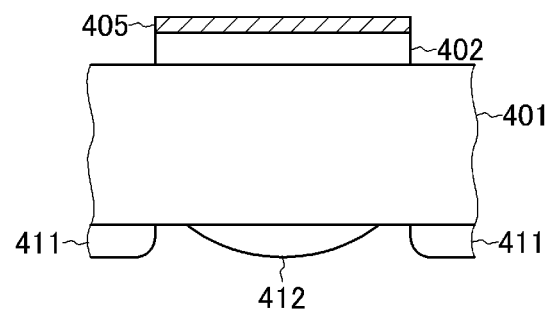
FIG. 10C is a sectional view showing a state of a process in order to illustrate the conventional method of manufacturing a light receiving element.
Figure 10D:
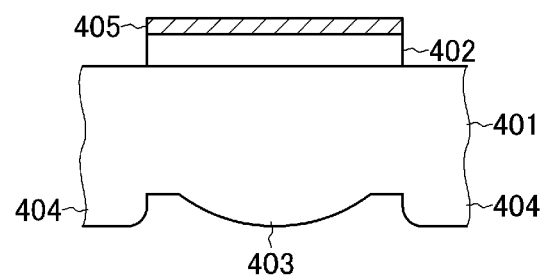
FIG. 10D is a sectional view showing a state of a process in order to illustrate the conventional method of manufacturing a light receiving element.
Figure 10E:
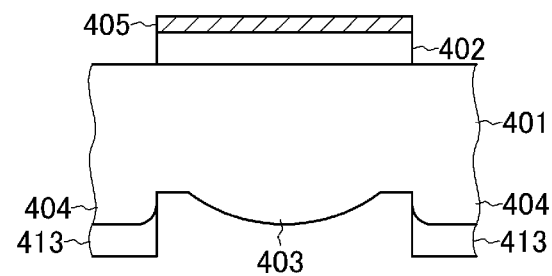
FIG. 10E is a sectional view showing a state of a process in order to illustrate the conventional method of manufacturing a light receiving element.
Figure 10F:
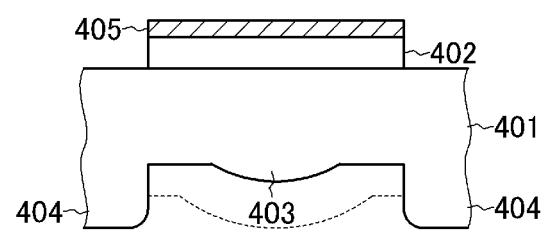
FIG. 10F is a sectional view showing a state of a process in order to illustrate the conventional method of manufacturing a light receiving element.

FIG. 7 shows imaging results. As shown in (a) of FIG. 7, when the adhesive layer formed from a resin thermosetting adhesive is thermally cured without performing provisional bonding using the ultraviolet curable adhesive, the positioning state shifts following curing. In contrast, as shown in (b) of FIG. 7, when provisional bonding is implemented using the ultraviolet curable adhesive, the positioning state does not shift even after the adhesive layer formed from a resin thermosetting adhesive is thermally cured. Note that the result shown in (b) of FIG. 7 was obtained when provisional bonding was performed in 6 locations.

According to embodiments of the present invention, as described above, a first substrate that includes a photodiode and a second substrate that is constituted by a semiconductor having a lens with a concave surface formed thereon are adhered by an adhesive layer formed from a resin adhesive, and as a result, a light receiving element in which a lens is integrated with a photodiode can be manufactured with good reproducibility.

Note that the present invention is not limited to the embodiment described above, and it goes without saying that many modifications and combinations may be implemented within the technical scope of the invention by persons having general knowledge in the relevant field.

REFERENCE SIGNS LIST

100 Light receiving element
101 First substrate
102 Photodiode
103 Second substrate
104 Lens
105 Adhesive layer
106 Pedestal portion
107 Electrode
111 Anti-reflection film
112 Anti-reflection film
113 Anti-reflection film.

The invention claimed is:
1. A light receiving element comprising:
a first substrate;

a photodiode on a top surface of the first substrate so that a light receiving side of the photodiode is oriented toward the first substrate;

a second substrate comprising a semiconductor, an adhesion surface of the second substrate being adhered to a rear surface side of the first substrate by an adhesive layer, the adhesive layer comprising a resin adhesive; and a lens, a convex surface of the lens facing the adhesion surface of the second substrate, the lens being disposed in a light receiving region of the photodiode.

2. The light receiving element according to claim 1, wherein the adhesive layer is charged between the first substrate and the second substrate.

3. The light receiving element according to claim 1, further comprising a pedestal portion around the lens on the adhesion surface of the second substrate, wherein a height of the pedestal portion and a height of the lens are equal.

4. An element manufacturing method comprising:

bringing a first substrate having a first element formed thereon and a second substrate having a second element formed thereon into contact with each other via an adhesive layer, the adhesion layer comprising a resin thermosetting adhesive;

moving the first substrate and the second substrate relative to each other in order to align respective positions of the first element and the second element;

applying an ultraviolet curable adhesive to bonding locations of the first substrate and the second substrate;

provisionally bonding the first substrate to the second substrate by irradiating the ultraviolet curable adhesive with ultraviolet rays cure the ultraviolet curable adhesive; and bonding the first substrate to the second substrate by heating the adhesive layer to cure the adhesive layer.

5. The element manufacturing method according to claim 4, wherein the first element is a photodiode formed on a top surface of the first substrate so that a light receiving side of the photodiode is oriented toward the first substrate, wherein the second element is a lens that has a convex surface facing a surface of the second substrate adhered to the first substrate, wherein the second substrate comprises a semiconductor, and wherein the lens is disposed in a light receiving region of the photodiode.

6. The element manufacturing method according to claim 5, wherein the second element further includes a pedestal portion around the lens on the surface of the second substrate adhered to the first substrate, and wherein a height of the pedestal portion and a height of the lens are equal.

* * * * *